United States Patent
Saito et al.

(10) Patent No.: US 11,443,922 B2
(45) Date of Patent: Sep. 13, 2022

(54) HIGH FREQUENCY POWER SUPPLY MEMBER AND PLASMA PROCESSING APPARATUS

(71) Applicant: Tokyo Electron Limited, Tokyo (JP)

(72) Inventors: Michishige Saito, Miyagi (JP); Yousuke Nagahata, Miyagi (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 17/348,999

(22) Filed: Jun. 16, 2021

(65) Prior Publication Data

US 2021/0398782 A1 Dec. 23, 2021

(30) Foreign Application Priority Data

Jun. 23, 2020 (JP) .............................. JP2020-107987

(51) Int. Cl.
*H01J 37/32* (2006.01)
(52) U.S. Cl.
CPC .. *H01J 37/32577* (2013.01); *H01J 37/32183* (2013.01)

(58) Field of Classification Search
None
See application file for complete search history.

(56) References Cited

U.S. PATENT DOCUMENTS

2011/0240598 A1* 10/2011 Okayama ............ C23C 16/4558
156/345.36

FOREIGN PATENT DOCUMENTS

JP 2019-021803 2/2019

* cited by examiner

*Primary Examiner* — Henry Luong
(74) *Attorney, Agent, or Firm* — IPUSA, PLLC

(57) ABSTRACT

A high frequency power supply member for supplying high frequency power includes: an inner conductor that forms a hollow; and an outer conductor arranged to surround the inner conductor, wherein a refrigerant flow path is provided inside a wall surface of at least one of the inner conductor and the outer conductor.

10 Claims, 4 Drawing Sheets

HIGH FREQUENCY POWER SUPPLY MEMBER AND PLASMA PROCESSING APPARATUS

CROSS-REFERENCE TO RELATED APPLICATION

The present application is based upon and claims priority to Japanese Patent Application No. 2020-107987, filed on Jun. 23, 2020, the entire contents of which are incorporated herein by reference.

BACKGROUND OF THE INVENTION

1. Field of the Invention

The present disclosure relates to a high frequency power supply member and a plasma processing apparatus.

2. Description of the Related Art

For example, Patent Document 1 discloses a plasma processing apparatus that includes a high frequency power supply member electrically connecting a first high frequency power source and a second high frequency power source to a lower electrode and that applies high frequency power to the lower electrode.

PRIOR ART DOCUMENT

Patent Document

[Patent Document 1] Japanese Laid-open Patent Publication No. 2019-21803

The present disclosure provides a technique that can reduce a thermal load in a transmission path of high frequency power.

SUMMARY OF THE INVENTION

According to one aspect of the present disclosure, a high frequency power supply member for supplying high frequency power includes: an inner conductor that forms a hollow; and an outer conductor arranged to surround the inner conductor, wherein a refrigerant flow path is provided inside a wall surface of at least one of the inner conductor and the outer conductor.

According to one aspect, it is possible to reduce a thermal load in a transmission path of high frequency power.

DESCRIPTION OF THE EMBODIMENTS

Figure 1:
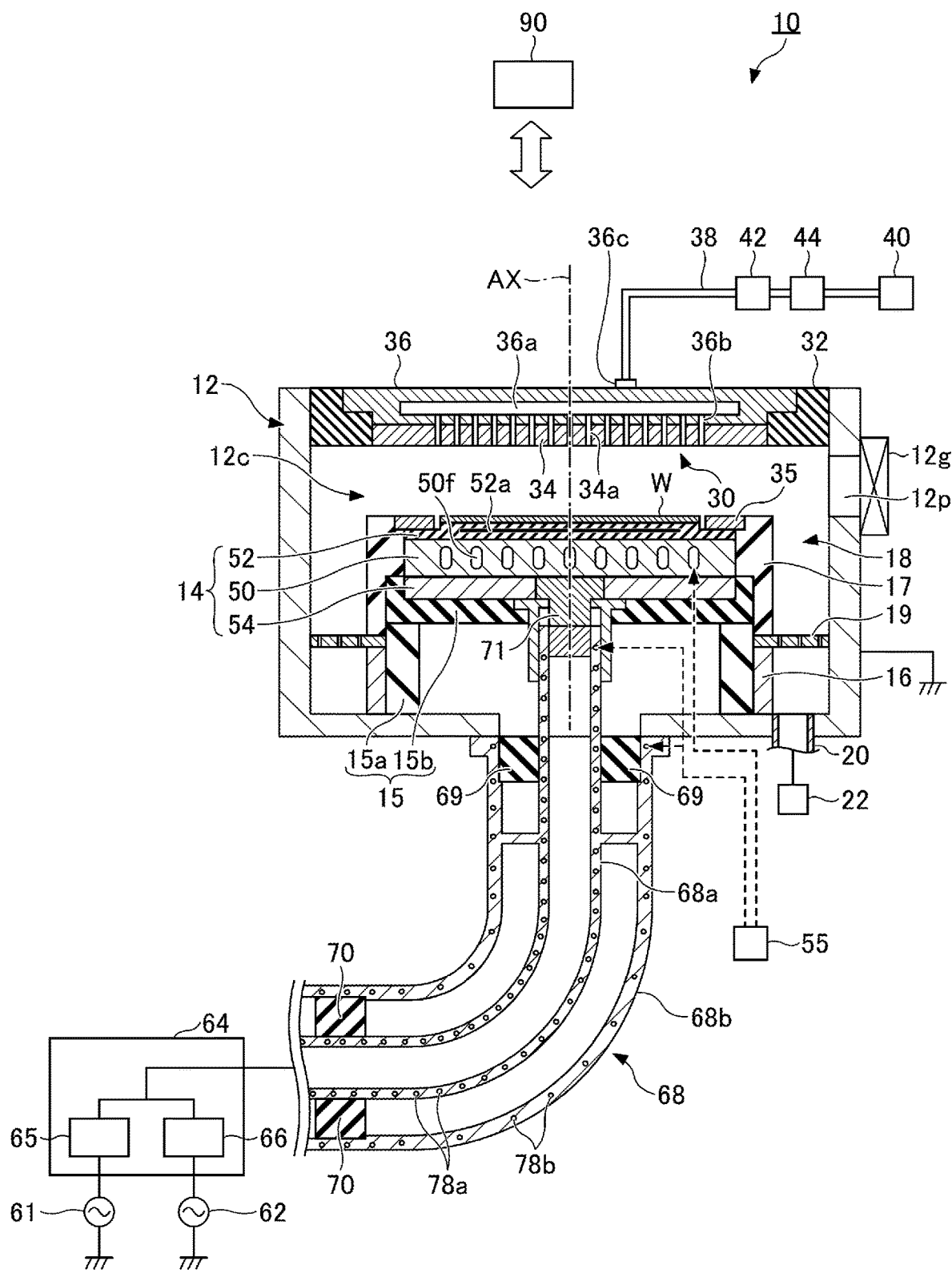
FIG. 1 is a diagram schematically illustrating a plasma processing apparatus according to one embodiment.

In the following, an embodiment for carrying out the present disclosure will be described with reference to the drawings. In each drawing, the same components are indicated by the same reference numerals and overlapping descriptions may be omitted.

[Plasma Processing Apparatus]

A plasma processing apparatus 10 according to one embodiment will be described with reference to FIG. 1. FIG. 1 is a diagram schematically illustrating the plasma processing apparatus according to one embodiment. The plasma processing apparatus 10 illustrated in FIG. 1 is a capacitively coupled plasma processing apparatus.

The plasma processing apparatus 10 includes a chamber body 12. The chamber body 12 has a substantially cylindrical shape, and provides an inner space thereof as a chamber 12c. The chamber body 12 may be made of, e.g., aluminum or stainless steel. The chamber body 12 is grounded. A plasma resistant film is formed on an inner wall surface of the chamber body 12, i.e., a wall surface defining the chamber 12c. This film may be a film formed by an anodic oxidation treatment or a ceramic film such as a film made of yttrium oxide. An opening 12p is formed at a sidewall of the chamber body 12. A semiconductor wafer as an example of a substrate W passes through the opening 12p when it is carried into the chamber 12c and when it is carried out from the chamber 12c. A gate valve 12g for opening/closing the opening 12p is attached to the sidewall of the chamber body 12. It should be noted that the substrate W may be a disc-shaped plate made of, e.g., silicon.

A stage 14 is provided in the chamber 12c. The stage 14 is configured to support the substrate W in the chamber 12c. The stage 14 is supported by a support 15. In one embodiment, the support 15 has a first member 15a and a second member 15b. The first member 15a is made of an insulator such as ceramic. The first member 15a has a substantially cylindrical shape. The first member 15a extends upward from the bottom of the chamber body 12. The second member 15b is provided on the upper end of the first member 15a. The second member 15b is made of an insulator such as ceramic. The second member 15b has a substantially annular plate shape. That is, the second member 15b has a substantially disc shape opened at the center. The stage 14 is provided on the second member 15b. The stage 14 and the support 15 are coupled to ensure airtightness of the space in the chamber body 12.

A tubular section 16 extends upward from the bottom of the chamber body 12. The tubular section 16 is made of a conductor and has a substantially cylindrical shape. The tubular section 16 extends along the outer periphery of the first member 15a of the support 15, and the potential of the tubular section 16 is set to the ground potential. An insulating member 17 is provided above the tubular section 16. The insulating member 17 is made of an insulator such as quartz, and has a substantially cylindrical shape. The insulating member 17 extends along the outer periphery of the stage 14 and the outer periphery of the second member 15b of the support 15. A gas exhaust path 18 is formed between the tubular section 16 and the sidewall of the chamber body 12 and between the insulating member 17 and the sidewall of the chamber body 12.

A baffle plate 19 is provided in the gas exhaust path 18. The baffle plate 19 has a substantially annular plate shape. The baffle plate 19 may be formed, for example, by coating an aluminum base material with ceramic such as yttrium oxide. A plurality of through-holes are formed in the baffle plate 19. The inner periphery of the baffle plate 19 is held between the tubular section 16 and the insulating member 17. The outer periphery of the baffle plate 19 is coupled to the sidewall of the chamber body 12. Below the baffle plate 19, a gas exhaust pipe 20 is connected to the bottom of the chamber body 12. A gas exhaust device 22 is connected to the gas exhaust pipe 20. The gas exhaust device 22 includes a pressure controller such as an automatic pressure control valve, and a vacuum pump such as a turbo molecular pump, and thus can decrease the pressure in the chamber 12c.

The plasma processing apparatus 10 further includes an upper electrode 30. The upper electrode 30 is provided above the stage 14. The upper electrode 30 blocks an upper opening of the chamber body 12 in cooperation with a member 32. The member 32 has an insulating property. The upper electrode 30 is held on the upper section of the chamber body 12 through the member 32. It should be noted that the potential of the upper electrode 30 is set to the ground potential when a first high frequency power source to be described later is electrically connected to the lower electrode of the stage 14.

The upper electrode 30 includes a ceiling plate 34 and a support 36. The lower surface of the ceiling plate 34 defines the chamber 12c. The ceiling plate 34 is provided with a plurality of gas discharge holes 34a. Each of the gas discharge holes 34a penetrates the ceiling plate 34 in the plate thickness direction (vertical direction). The ceiling plate 34 may be made of, e.g., silicon, but is not limited thereto. Alternatively, the ceiling plate 34 may have a structure in which a plasma resistant film is provided on a surface of an aluminum base material. This film may be a film formed by an anodic oxidation treatment or a ceramic film such as a film made of yttrium oxide.

The support 36 is a component that detachably supports the ceiling plate 34. The support 36 may be made of a conductive material, e.g., aluminum. A gas diffusion space 36a is provided inside the support 36. A plurality of gas holes 36b extend downward from the gas diffusion space 36a. Each of the gas holes 36b communicates with the gas discharge holes 34a. A gas inlet port 36c for introducing a gas into the gas diffusion space 36a is formed in the support 36, and a gas supply pipe 38 is connected to the gas inlet port 36c.

A gas source group 40 is connected to the gas supply pipe 38 through a valve group 42 and a flow rate controller group 44. The gas source group 40 includes a plurality of gas sources, the valve group 42 includes a plurality of valves, and the flow rate controller group 44 includes a plurality of flow rate controllers. Each of the flow rate controllers of the flow rate controller group 44 is a mass flow controller or a pressure control type flow rate controller. The respective gas sources of the gas source group 40 are connected to the gas supply pipe 38 through the corresponding valves of the valve group 42 and the corresponding flow rate controllers of the flow rate controller group 44. The plasma processing apparatus 10 can supply gases from one or more gas sources selected among the plurality of gas sources of the gas source group 40 into the chamber 12c at individually controlled flow rates.

The plasma processing apparatus 10 further includes a controller 90. The controller 90 is a computer including a processor, a storage device, an input device, a display device, and the like, and controls the respective components of the plasma processing apparatus 10. Specifically, the controller 90 executes a control program stored in the storage device, and controls the respective components of the plasma processing apparatus 10 based on recipe data stored in the storage device. Thus, in the plasma processing apparatus 10, a process specified by the recipe data is performed under the control of the controller 90.

[High Frequency Power Supply Member]

Figure 2A:
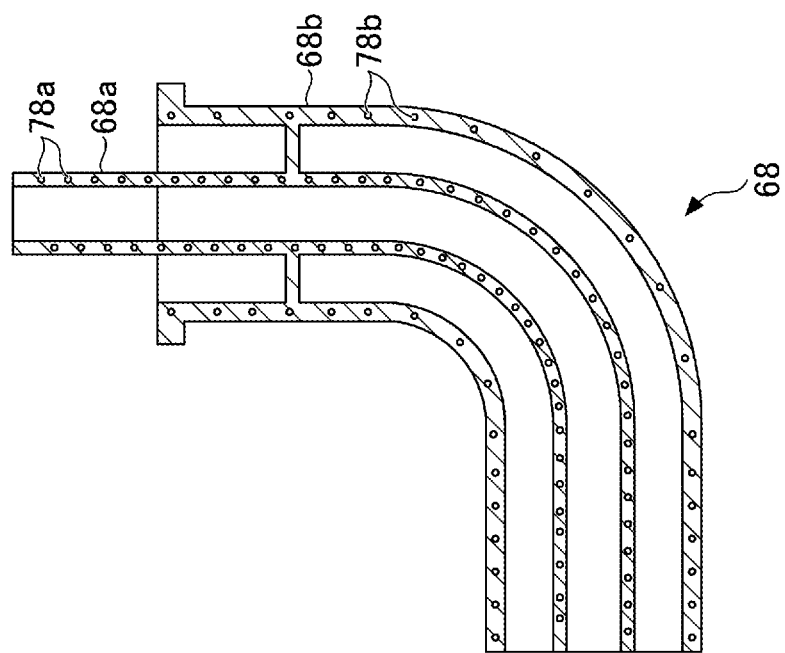
FIGS. 2A and 2B are diagrams illustrating a high frequency power supply member according to one embodiment.
Figure 2B:
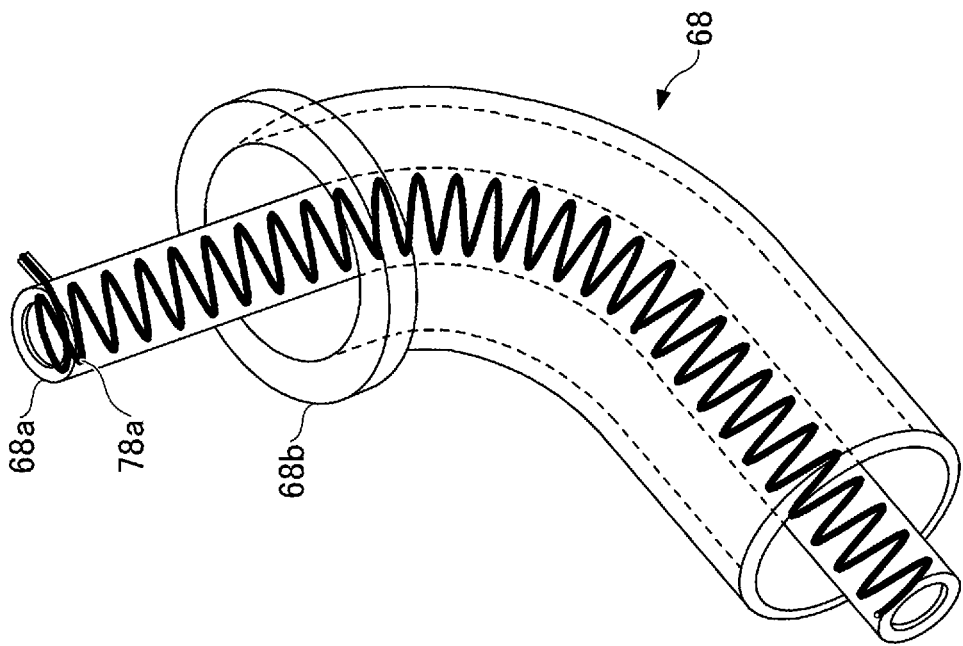

In the following, the stage 14 and components of the plasma processing apparatus 10 relating to the stage 14 will be described in detail, with reference to FIG. 2 together with FIG. 1. FIG. 2A illustrates a longitudinal cross-sectional view of a high frequency power supply member 68 according to one embodiment, and FIG. 2B illustrates a perspective view of the high frequency power supply member 68 according to one embodiment.

As illustrated in FIG. 1, the stage 14 includes a lower electrode 50 and an electrostatic chuck 52. In one embodiment, the stage 14 further includes a conductive member 54. The lower electrode 50 has a substantially disc shape and is made of a conductor such as aluminum. A flow path 50f is formed in the lower electrode 50. A refrigerant is supplied into the flow path 50f from a chiller unit 55 provided outside the chamber body 12. The coolant supplied into the flow path 50f is returned to the chiller unit 55.

The conductive member 54 is provided below the lower electrode 50. The conductive member 54 may be made of, e.g., aluminum. The conductive member 54 is electrically connected to the lower electrode 50. In one embodiment, the conductive member 54 has a substantially annular plate shape. In one embodiment, the conductive member 54, the lower electrode 50, and the electrostatic chuck 52 share a common central axis (hereinafter, referred to as the "axis AX"). It should be noted that the axis AX is also the central axis of the chamber body 12 and the chamber 12c in one embodiment.

In one embodiment, the plasma processing apparatus 10 further includes a first high frequency power source 61 and a second high frequency power source 62. The first high frequency power source 61 and the second high frequency power source 62 are provided outside the chamber body 12. The first high frequency power source 61 mainly generates a first high frequency power that contributes to plasma generation. The frequency of the first high frequency power may be, e.g., 100 MHz. The first high frequency power source 61 is electrically connected to the lower electrode 50 via a matching circuit 65 of a matching device 64 for impedance matching. The matching circuit 65 has a circuit configured to match the output impedance of the first high frequency power source 61 and the impedance on a load side. It should be noted that the first high frequency power source 61 may be connected to the upper electrode 30 via the matching circuit 65.

The second high frequency power source 62 mainly outputs a second high frequency power that contributes to the attraction of ions with respect to the substrate W. The frequency of the second high frequency power is lower than the frequency of the first high frequency power, and may be, e.g., 13 MHz. The second high frequency power source 62 is electrically connected to the lower electrode 50 via a matching circuit 66 of the matching device 64. The matching circuit 66 has a circuit configured to match the output impedance of the second high frequency power source 62 and the impedance on the load side.

The plasma processing apparatus 10 further includes a high frequency power supply member 68. The high frequency power supply member 68 is made of a conductor such as aluminum and has a substantially cylindrical shape. The high frequency power supply member 68 is provided to electrically connect the first high frequency power source 61 and the second high frequency power source 62 to the lower electrode 50. The high frequency power supply member 68 has a structure of extending from the lower electrode 50 side to the outside of the chamber body 12 and of being curved outside the chamber body 12.

In one embodiment, the central axis of the upper end of the high frequency power supply member 68 is provided to match the axis AX. One end (upper end) of the high frequency power supply member 68 extends in the vertical direction and is connected to the lower electrode 50 through a bonding member 71 provided at an opening of the second member 15*b* opened at the center. The high frequency power supply member 68 is curved approximately 90° in the middle of extending downward from one end (upper end) in the vertical direction, and then extends in the horizontal direction to the other end of the high frequency power supply member 68. The other end of the high frequency power supply member 68 is connected to the first high frequency power source 61 and the second high frequency power source 62 via the matching device 64. In one embodiment, the matching device 64 is provided on the side of the high frequency power supply member 68. It should be noted that the high frequency power supply member 68 has a curved structure in the present embodiment but may have a straight line shape extending in the vertical direction without being curved.

As illustrated in FIG. 1 and FIG. 2, in one embodiment, the high frequency power supply member 68 includes an inner conductor 68*a* and an outer conductor 68*b*. The inner conductor 68*a* and outer conductor 68*b* have curved structures. The inner conductor 68*a* is made of a conductor such as aluminum and forms a hollow. The outer conductor 68*b* is made of a conductor such as aluminum and is arranged to form a hollow and surround the inner conductor 68*a*. The inner conductor 68*a* is fitted in the inner hole of the outer conductor 68*b* and the upper end section of the inner conductor 68*a* is exposed from the outer conductor 68*b*. The inner conductor 68*a* and outer conductor 68*b* are curved in the same direction.

A high frequency current output from the first high frequency power source 61 and the second high frequency power source 62 flows from the matching device 64 through the surface of the inner conductor 68*a* toward the lower electrode 50. That is, the inner conductor 68*a* is a transmission path of high frequency power that is supplied from the matching device 64 to the lower electrode 50. The outer conductor 68*b* is a transmission path for when the high frequency power returns from the chamber body 12 to a ground potential area through plasma.

The inner conductor 68*a* and the outer conductor 68*b* have coaxial structures. The axis AX in one embodiment is the central axis of the inner conductor 68*a* and the outer conductor 68*b* at the upper section of the inner conductor 68*a* and the top of the outer conductor 68*b*. The potential of the outer conductor 68*b* is set to the ground potential.

It should be noted that the inner conductor 68*a* and the outer conductor 68*b* have curved structures in the present embodiment, but may have a straight line shape extending in the vertical direction without being curved. The cross-sections of the inner conductor 68*a* and the outer conductor 68*b* are not limited to true circles, but may be rectangular or elliptical.

The electrostatic chuck 52 is provided on the lower electrode 50. The electrostatic chuck 52 is configured to hold the substrate W mounted thereon. The electrostatic chuck 52 has a substantially disc shape and has a layer made of an insulator such as ceramic. The electrostatic chuck 52 further has an electrode 52*a* as an inner layer in the layer made of an insulator. For example, when a DC voltage is applied to the electrode 52*a*, the electrostatic chuck 52 generates an electrostatic force of attraction. By the generated electrostatic force of attraction, the electrostatic chuck 52 holds the substrate W. An edge ring 35 is arranged on the peripheral edge of the substrate W so as to surround the substrate W. The edge ring 35 is also referred to as a focus ring.

A heater may be provided within the electrostatic chuck 52. The heater may be composed of a resistive heating element. The temperature of the substrate W that is mounted on the stage 14 is adjusted by the temperature of the heater and the refrigerant supplied to the flow path 50*f*. It should be noted that the stage 14 may be provided with a gas line for supplying heat transfer gas, such as He gas, between the substrate W and the electrostatic chuck 52.

In the present embodiment, the high frequency power supply member 68 is provided with the refrigerant flow path 78*a* inside the wall surface of the inner conductor 68*a*. Also, the refrigerant flow path 78*b* is provided inside the wall surface of the outer conductor 68*b*. However, a refrigerant flow path may be provided in the wall surface of at least one of the inner conductor 68*a* and the outer conductor 68*b*.

In the example of FIG. 2B, the refrigerant flow path 78*a* is provided inside the wall surface of the inner conductor 68*a*, and the refrigerant flow path 78*b* inside the wall surface of the outer conductor 68*b* is not illustrated. The refrigerant flow path 78*a* has a helical structure. Thus, the flow path length of the refrigerant flow path 78*a* can be maximized inside the wall surface of the inner conductor 68*a*, and the cooling efficiency can be increased. Similarly, in order to increase the cooling efficiency, the refrigerant flow path 78*b* formed inside the wall surface of the outer conductor 68*b* preferably has a helical structure. However, the refrigerant flow path 78*a* and the refrigerant flow path 78*b* are not limited to such a structure, but may be, for example, a linear flow path including a branch inside the wall surfaces of the inner conductor 68*a* and the outer conductor 68*b*, or may be an annular flow path. Also, the refrigerant flow path 78*a* and the refrigerant flow path 78*b* may partially protrude from the inside of the wall surfaces of the inner conductor 68*a* and the outer conductor 68*b*.

It should be noted that although there are no protrusions/recesses on the surfaces of the inner conductor 68*a* and the outer conductor 68*b* as the transmission paths of high frequency power in the present embodiment, protrusions/recesses may be present on the surfaces of the inner conductor 68*a* and the outer conductor 68*b*.

When a DC voltage or the like is applied to the lower electrode 50 and/or the edge ring 35 or an AC voltage is applied to the heater in the electrostatic chuck 52, wiring may be formed in the hollow inner conductor 68*a*.

[Refrigerant Flow Path]

As illustrated in FIG. 1, the high frequency power supply member 68 has insulating components 69 and 70 that support the inner conductor 68*a* and the outer conductor 68*b*. The inner conductor 68*a* and the outer conductor 68*b* are made of a metal. The inner conductor 68*a* is a supply path of high frequency power and the outer conductor 68*b* is a return path of high frequency power. Therefore, it is important that the inner conductor 68*a* and the outer conductor 68*b* are not electrically connected. Therefore, the insulating components 69 and 70 are interposed between the inner conductor 68*a* and the outer conductor 68*b* to insulate the inner conductor 68*a* and the outer conductor 68*b* so that they are not electrically connected.

For example, there is a step of etching a deep hole having a high aspect ratio for a device structure that is formed on the substrate W. In such a step, the high frequency power that is output per unit time from the first high frequency power source 61 and/or the second high frequency power source 62 is high and the thermal load to the high frequency power supply member 68, which is a transmission path of high frequency power, increases. In the present embodiment, by causing the refrigerant to flow through the refrigerant flow paths 78a and 78b also in such a step of applying the high frequency power with high output, the temperature rise of the inner conductor 68a and the outer conductor 68b is reduced. Thus, the temperature rise of the insulating components 69 and 70 can be suppressed, and the insulating components 69 and 70 can be used at a temperature below the allowable temperature of resin materials constituting these components.

Although not illustrated in FIG. 1, various components are combined around the insulating components 69 and 70. Thus, when the thermal load to the high frequency power supply member 68 is increased, gaps are generated at the engagement portion of each component combined by thermal expansion due to the temperature increase, which increases the contact resistance of the electrical contacts at the contact portion, and may cause burnout due to abnormal heating at the contact portion.

In contrast, in the present embodiment, by causing the refrigerant to flow through the refrigerant flow paths 78a and 78b, the thermal load applied to the high frequency power supply member 68 is reduced and the temperature rise is suppressed. Thus, it is possible to suppress loosening of the joints of the insulating components 69 and 70 and the components surrounding them due to the temperature increase. As a result, the contact resistance of the electrical contact can be reduced, and burnout of the contact portion can be avoided. It is also possible to prevent the insulating components 69 and 70 from melting beyond the melting point of the member.

As the refrigerant flowing through the refrigerant flow paths 78a and 78b, brine, which is a fluorocarbon-based refrigerant, may be used in a case in which the refrigerant is used at 100° C. or more, but water, which has a boiling point at 100° C., cannot be used. On the other hand, in a case in which the refrigerant is used at a temperature less than 100° C., the refrigerant may be cooling water or air cooling. In the case of air cooling, an inert gas such as air, dry air, or $N_2$ gas may be used.

As illustrated in FIG. 1, the refrigerant is controlled to a predetermined temperature in the chiller unit 55 and supplied to the refrigerant flow paths 78a and 78b. Also, the refrigerant is supplied from the chiller unit 55 to the flow path 50f inside the lower electrode 50. The flow path 50f inside the lower electrode 50 and the refrigerant flow paths 78a and 78b may be connected or may not be connected.

Figure 3A:
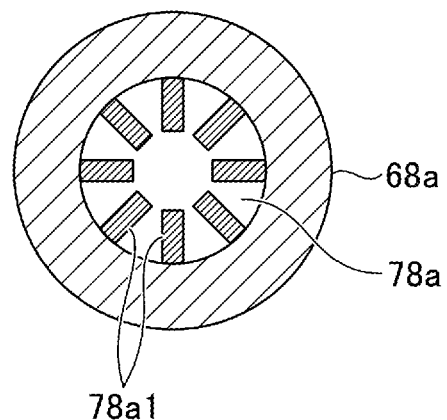
FIGS. 3A to 3C are diagrams illustrating examples of protrusions in a refrigerant flow path according to one embodiment.
Figure 3B:
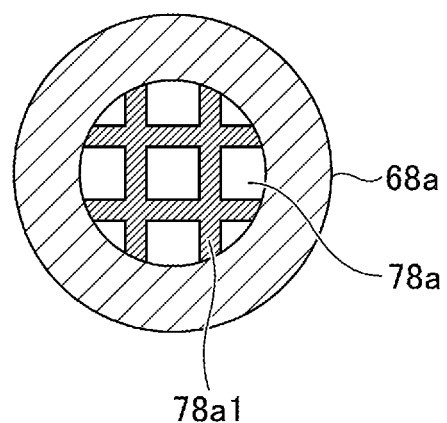
Figure 3C:
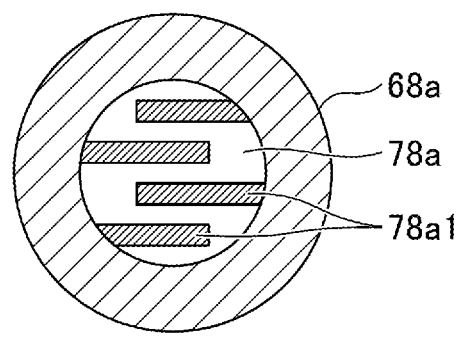

Protrusions may be formed inside the refrigerant flow paths 78a and 78b. FIGS. 3A to 3C are diagrams illustrating examples of protrusions 78a1 in the refrigerant flow path 78a formed in the inner conductor 68a according to one embodiment. FIG. 3A illustrates an example of protrusions in the refrigerant flow path 78a, and the shapes of the protrusions in the refrigerant flow path 78a will be described below. Protrusions may also be formed in the refrigerant flow path 78b similarly to the refrigerant flow path 78a.

Examples of the shape of protrusions in the refrigerant flow path 78a are illustrated in FIG. 3A to FIG. 3C. FIG. 3A through FIG. 3C illustrate a plane of the refrigerant flow path 78a cut vertically in the flowing direction of the refrigerant. In FIG. 3A, a plurality of protrusions 78a1 are formed in a fin shape. By the refrigerant flowing between the plurality of fin-shaped protrusions 78a1, the surface area in contact with the refrigerant can be increased and the heat dissipation efficiency can be increased. It should be noted that the protrusions 78a1 inside the refrigerant flow path 78a are not limited to a fin-shaped member, but may have a grid shape as illustrated in FIG. 3B, a columnar shape as illustrated in FIG. 3C, or another shape.

[Manufacturing of High Frequency Power Supply Member]

Conventionally, an inner conductor 68a and an outer conductor 68b are manufactured separately by a cutting process or the like. Therefore, after the inner conductor 68a and the outer conductor 68b are manufactured, it is necessary to insert the inner conductor 68a into the outer conductor 68b, and thus the inner conductor 68a and the outer conductor 68b have shape restrictions.

Conversely, when the high frequency power supply member 68 is shaped by a 3D printer, the manufacturing restrictions for inserting the inner conductor 68a into the outer conductor 68b can be eliminated, and the degree of freedom in designing the shapes of the inner conductor 68a and the outer conductor 68b can be increased.

The high frequency power supply member 68 may be manufactured not only by a 3D printer but also by casting. However, it is preferable that the high frequency power supply member 68 according to the present embodiment, which has a complex structure in which refrigerant flow paths are formed inside the inner conductor 68a and the outer conductor 68b and protrusions are further formed inside the refrigerant flow paths, be shaped by a 3D printer.

Figure 4:
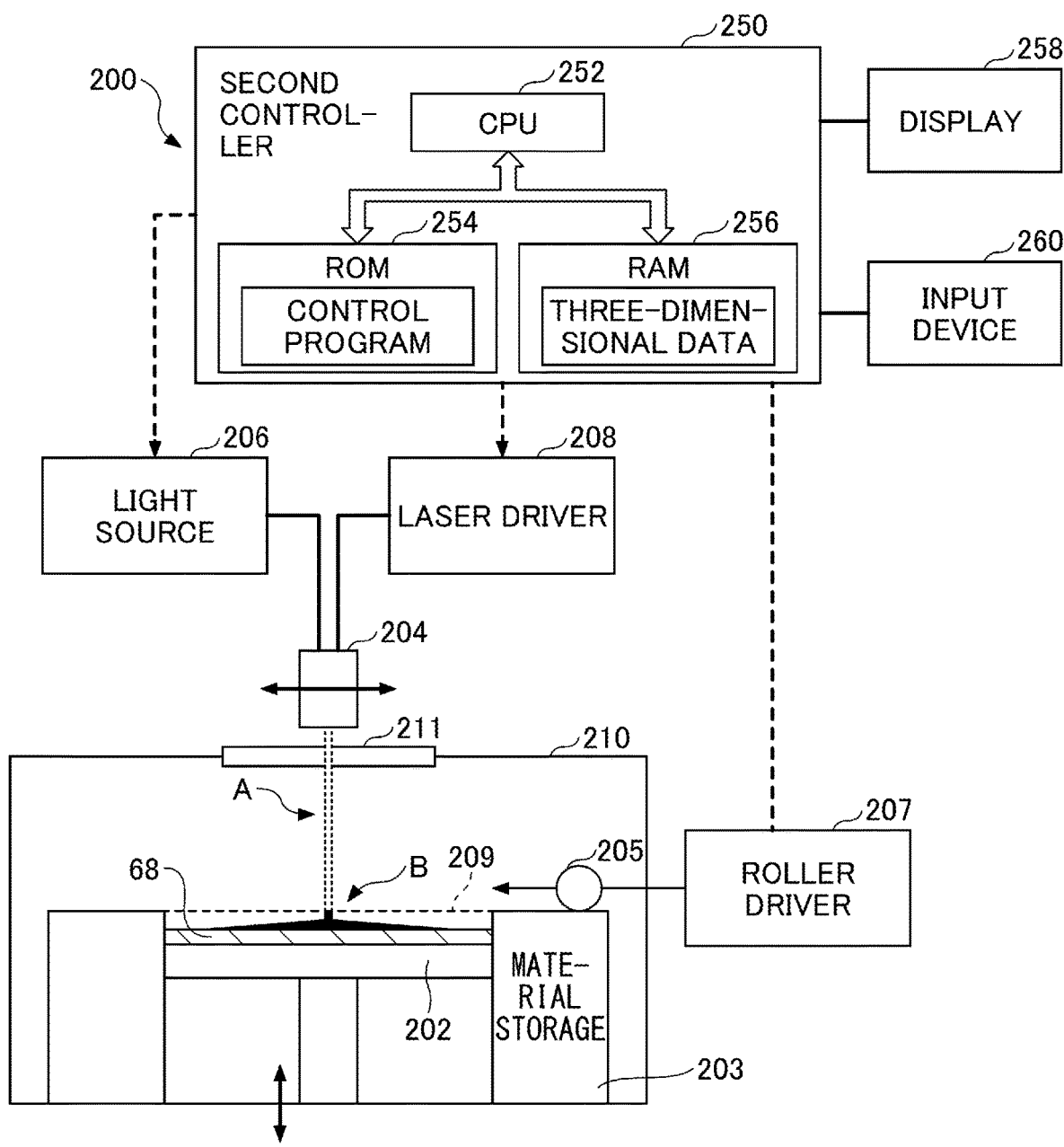
FIG. 4 is a diagram illustrating an example of a 3D printer that is used to shape the high frequency power supply member according to one embodiment.

An example of a 3D printer 200 that shapes a high frequency power supply member 68 will be described with reference to FIG. 4. FIG. 4 is a diagram illustrating an example of the 3D printer 200 that is used to shape the high frequency power supply member 68 according to one embodiment.

The 3D printer 200 according to the present embodiment stores three-dimensional data for forming the high frequency power supply member 68 as a three-dimensional shaped product in a storage such as a RAM 256, and manufactures the high frequency power supply member 68 based on the three-dimensional data. The high frequency power supply member 68 is formed on a mounting surface of a stage 202 provided at a table. The stage 202 can be raised and lowered, for example, gradually, in accordance with the progress of formation of the high frequency power supply member 68.

In the present embodiment, a raw material powder of each material that forms the high frequency power supply member 68 is stored in a material storage 203 provided at the table. It should be noted that the raw material of each material that forms the high frequency power supply member 68 is not limited to a powder-like material, but may be a wire-like material. In the chamber 210, an energy beam is emitted while the raw material powder is supplied to melt the raw material powder. In the present embodiment, a laser light A (an optical laser) is used as the energy beam to be emitted.

The laser light A is output from a light source 206 to be emitted to a predetermined position that is positioned by a laser scanning device 204 for two-dimensional scanning. The light source 206 and the laser scanning device 204 are preferably arranged outside the chamber 210. The laser scanning device 204 moves to the predetermined position by the second controller 250 driving the laser driver 208.

The laser scanning device 204 scans the laser light A in at least two dimensional (XY) directions on the stage 202. For example, the laser scanning device 204 is controlled to move the emitted spot of the laser light A on the stage 202 in accordance with on the three-dimensional data indicating the three-dimensional structure including the refrigerant flow paths 78a and 78b in the inner conductor 68a and the outer conductor 68b.

The second controller 250 controls the roller driver 207 and drives the roller 205. Thus, the powder of the material of the inner conductor 68a and outer conductor 68b is supplied to the laser light scanning space 209. It should be noted that it is preferable that the temperature of the material storage 203 is adjusted by a heater. Also, it is preferable that the chamber 210 is provided with a mechanism that is able to supply an inert gas and evacuate the chamber 210.

The laser light A, which is scanned in the two-dimensional directions by the laser scanning device 204, is emitted via a ceiling of the chamber 210, e.g., a laser transparent window 211 provided above the stage 202 to the emission area on the stage 202. The laser light A heats the powder and melts and solidifies the powder as illustrated in B to form the high frequency power supply member 68 that includes the inner conductor 68a and the outer conductor 68b in which the refrigerant flow paths 78a and 78b are formed.

The second controller 250 includes a CPU 252, a ROM 254, and a RAM 256. The second controller 250 controls the supply of the raw material powder from the material storage 203 and raises and lowers the stage 202. Also, the second controller 250 performs lighting control of the light source 206, scanning control of the laser scanning device 204, and control of the roller driver 207 and the laser driver 208. Thereby, the second controller 250 controls the operation of manufacturing the high frequency power supply member 68.

A control program that is executed by the CPU 252 is stored in the ROM 254, for example. The CPU 252 controls the manufacturing of the high frequency power supply member 68 by executing the control program, for example, based on the three-dimensional data stored in the RAM 256. It should be noted that the control program may be stored in a fixed recording medium, or may be stored in a recording medium that is detachable and computer-readable such as various flash memories or optical (magnetic) disks.

The second controller 250 further includes a display 258 and an input device 260 such as, a keyboard and a pointing device. The display 258 is used to display the progress of the formation of the high frequency power supply member 68 and the like. The input device 260 is used to input commands for starting and stopping the forming operation of the high frequency power supply member 68, and to input control parameters at the time of setting.

According to the high frequency power supply member 68 and the plasma processing apparatus 10 including the high frequency power supply member 68 of the present embodiment manufactured as described above, the refrigerant flow paths 78a and 78b are formed inside the inner conductor 68a and the outer conductor 68b. Thus, by causing the refrigerant to flow through the refrigerant flow paths 78a and 78b, the thermal load in the transmission paths of high frequency power of the high frequency power supply member 68 and therearound can be reduced.

The high frequency power supply member and the plasma processing apparatus according to one embodiment disclosed herein should be considered exemplary in all respects and are not limited thereto. The embodiments as described above may be changed and modified in various forms without departing from the appended claims and spirit thereof. The matters described in the embodiments as described above may take other configurations to the extent not inconsistent, and may be combined to the extent not inconsistent.

For example, the high frequency power supply member 68 is used for a transmission path for supplying high frequency power to the lower electrode 50 in the embodiment described above, but may also be used for a transmission path for supplying high frequency power to upper electrode 30.

A high frequency power supply member of the present disclosure can be applied to various types of plasma processing apparatuses, including an Atomic Layer Deposition (ALD) apparatus, a Capacitively Coupled Plasma (CCP) apparatus, an Inductively Coupled Plasma (ICP) apparatus, a Radial Line Slot Antenna (RLSA) apparatus, an Electron Cyclotron Resonance Plasma (ECR) apparatus, a Helicon Wave Plasma (HWP) apparatus, and the like.

What is claimed is:

1. A high frequency power supply member for supplying high frequency power, the high frequency power supply member comprising:
   an inner conductor that forms a hollow; and
   an outer conductor arranged to surround the inner conductor,
   wherein a refrigerant flow path is provided inside a wall surface of at least one of the inner conductor and the outer conductor.

2. The high frequency power supply member according to claim 1,
   wherein the inner conductor supplies the high frequency power to a load, and
   wherein the outer conductor is provided to return the high frequency power, returning from the load, to a ground potential area.

3. The high frequency power supply member according to claim 1, wherein the refrigerant flow path has a helical structure.

4. The high frequency power supply member according to claim 3, a protrusion is formed inside the refrigerant flow path.

5. The high frequency power supply member according to claim 4, wherein the protrusion is a grid-shaped, columnar, or fin-shaped member.

6. The high frequency power supply member according to claim 1, wherein inner conductor and the outer conductor have a coaxial structure.

7. The high frequency power supply member according to claim 1, wherein inner conductor and the outer conductor have a curved structure.

8. A plasma processing apparatus including a high frequency power supply member for supplying high frequency power,
   wherein the high frequency power supply member includes:
   an inner conductor that forms a hollow; and
   an outer conductor arranged to surround the inner conductor,
   wherein a refrigerant flow path is provided inside a wall surface of at least one of the inner conductor and the outer conductor.

9. The plasma processing apparatus according to claim 8,
   wherein the inner conductor supplies the high frequency power to a load, and
   wherein the outer conductor is provided to return the high frequency power, returning from the load, to a ground potential area.

10. The plasma processing apparatus according to claim 8, wherein the high frequency power supply member is coupled to a lower electrode and/or an upper electrode.

* * * * *